(12) United States Patent
Shepard et al.

(10) Patent No.: US 7,329,968 B2
(45) Date of Patent: Feb. 12, 2008

(54) CHARGE-RECYCLING VOLTAGE DOMAINS FOR ENERGY-EFFICIENT LOW-VOLTAGE OPERATION OF DIGITAL CMOS CIRCUITS

(75) Inventors: Kenneth Shepard, Ossining, NY (US); Saravanan Rajapandian, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 93 days.

(21) Appl. No.: 10/842,149

(22) Filed: May 10, 2004

(65) Prior Publication Data

US 2005/0127756 A1 Jun. 16, 2005

Related U.S. Application Data (60) Provisional application No. 60/470,605, filed on May 15, 2003, provisional application No. 60/468,867, filed on May 8, 2003.

(51) Int. Cl.
*H02J 1/10* (2006.01)
(52) U.S. Cl. ...................................................... 307/18
(58) Field of Classification Search ................ 307/69, 307/18
See application file for complete search history.

(56) References Cited

U.S. PATENT DOCUMENTS

| | | | |
|---|---|---|---|
| 5,781,001 A * | 7/1998 | Takemoto | 323/267 |
| 6,240,027 B1 * | 5/2001 | Lee et al. | 365/189.11 |
| 6,246,467 B1 * | 6/2001 | Yoshida | 356/3.01 |
| 6,479,974 B2 * | 11/2002 | Cohn et al. | 323/312 |
| 6,683,767 B2 * | 1/2004 | Ito et al. | 361/56 |
| 2004/0061148 A1 * | 4/2004 | Hsu | 257/239 |

OTHER PUBLICATIONS

Yang, B. et al., "A Low-Power ROM Using Charge Recycling and Charge Sharing Techniques," IEEE Journal of Solid-State Circuits, vol. 38, No. 4, Apr. 2003, pp. 641-653.
Patounakis, G. et al., "A Fully Integrated On-Chip DC-DC Conversion and Power Management System," IEEE Journal of Solid-State Circuits, vol. 39, No. 3, Mar. 2004, pp. 443-451.
Kao, J, et al., "Dual-Threshold Voltage Techniques for Low-Power Digital Circuits," IEEE Journal of Solid-State Circuits, vol. 35, No. 7, Jul. 2000, pp. 1009-1018.

(Continued)

*Primary Examiner*—Robert L. Deberadinis
(74) *Attorney, Agent, or Firm*—Wilmer Cutler Pickering Hale and Dorr LLP (57) ABSTRACT

An integrated circuit with multiple supply voltage domains includes a first domain and a second domain of electrical components. The first domain receives current from a first voltage rail and discharges electrical current to a second voltage rail. A second domain of electrical components receives current from the second voltage rail and discharges electrical current to a third voltage rail at a third voltage. An external voltage source provides a supply voltage across the first voltage rail and the third voltage rail. The integrated circuit further includes a regulator for regulating the second voltage rail. The circuit domains are divided into granules that can be multiplexed between domains when the supply voltage fluctuations are too large and too long for the regulator to handle. This concept may be extended to include additional domains of electrical components.

8 Claims, 7 Drawing Sheets

OTHER PUBLICATIONS

Yamauchi, H. et al., "An Asymptotically Zero Power Charge-Recycling Bus Architecture for Battery-Operated Ultrahigh Data Rate ULSI's," IEEE Journal of Solid-States Circuits, vol. 30, No. 4, Apr. 1995, pp. 423-431.

Montanaro, J. et al., "A 160-MHz, 32-b, 0.5-W CMOS RISC Microprocessor," IEEE Journal of Solid-State Circuits, vol. 31, No. 11, Nov. 1996, pp. 1703-1713.

Qu, G. et al., "Energy Minimization of System Pipelines Using Multiple Voltages," Proceedings of the 1999 IEEE International Symposium on Circuits and Systems, 1999, ISCAS '99, Jul. 1999, pp. 362-365 vol. 1.

Rajapandian, S. et al., "Energy-Efficient Low-Voltage Operation of Digital CMOS Circuits Through Charge-Recycling," 2004 Symposium on VLSI Circuits Digest of Technical Papers. Jun. 17-19, 2004 pp. 330-333.

Usami, K. et al., "Clustered Voltage Scaling Technique for Low-Power Design," International Symposium on Low Power Electronics and Design, Proceedings of the 1995 international symposium on Low power design tables of contents, Dana Point, California, United States, pp. 3-8, Year of Publication: 1995.

Rajapandian, S. et al., "Charge-recycling voltage domains for energy-efficient low-voltage operation of digital CMOS circuits," Proceedings. 21st International Conference on Computer Design, 2003, Oct. 13-15, 2003, pp. 98-102.

Lackey, D.E. et al., "Managing Power and Performance for System-on-Chip Designs using Voltage Islands," 2002 International Conference on Computer-Aided Design (ICCAD '02). pp. 195-202.

Semeraro, G. et al., "Energy-Efficient Processor Design Using Multiple Clock Domains with Dynamic Voltage and Frequency Scaling," Proceedings, Eighth International Symposium on High Performance Computer Architecture, 2002, Publication Date: Feb. 2-6, 2002, On pp. 29-40.

Wei, G. et al., "A Fully Digital, Energy-Efficient, Adaptive Power-Supply Regulator," IEEE Journal of Solid-State Circuits, vol. 34, No. 4, Apr. 1999.

Burd, T.D. et al., "Design Issues for Dynamic Voltage Scaling," Proceedings of the 2000 International Symposium on Low Power Electronics and Design, 2000. pp. 9-14.

* cited by examiner

CHARGE-RECYCLING VOLTAGE DOMAINS FOR ENERGY-EFFICIENT LOW-VOLTAGE OPERATION OF DIGITAL CMOS CIRCUITS

This application claims benefit of U.S. Provisional Patent Application Ser. No. 60/468,867, filed May 8, 2003, and of U.S. Provisional Patent Application Ser. No. 60/470,605, filed May 15, 2003, both of which are incorporated herein by reference.

BACKGROUND

In digital integrated circuits, the biggest "control know" available to adjust the amount of power the circuit dissipates is undeniably the supply voltage VDD. Significant energy savings can be realized by lowering the supply voltage until the circuits can just meet the specified performance requirements. We refer to this as dynamic voltage scaling. To accomplish this, what is needed is a very efficient adaptive power supply regulator, preferably one that is small and can be completely integrated on-chip.

Efficient on-chip dc-dc downconversion is also becoming a critical component in the design of deeply scaled digital CMOS ICs. Operating at supply voltages below 1 V, 90-nm (and below) technologies still demand in excess of 100 W of power in the largest chips. Delivering this power at the reduced supply voltage levels required by scaling results in high current requirements, exacerbating power supply integrity issues (i. e., forcing very low impedance requirements on the power distribution). Being able to bring the power onto the chip at higher voltage levels, which are then down-converted to the required supply voltage, significantly reduces the off-chip current requirements. We refer to this as high-tension power delivery.

The most efficient dc-dc voltage converters are buck-type regulators, which generate a reduced dc voltage level by filtering a pulse-width modulated (PWM) signal through a simple LC filter. A buck-type regulator can generate different dc voltage levels by varying the frequency of duty-cycle of the PMW signal. While buck converters can operate at very high efficiencies (>80%), they generally require off-chip filter components, which limits their usefulness for integrated circuit applications.

Two types of on-chip dc-dc converters do not require off-chip components: linear regulators and switched-capacitor power supplies. A linear regulator can be thought of as a variable resistor (implemented as a power FET) that is controlled to produce the required divide-down ratio. As such, its efficiency in generating a voltage Vout from VDD is limited to Vout/VDD. Switched-capacitor (SC) supplies allow one to produce lower voltages at higher efficiencies than linear regulators. SC supplies are effectively capacitance dividers, in which the capacitors are periodically "exchanged" as they are discharged by the load current.

The ideal efficiency of an SC power supply is limited by the amount of "ripple" produced at the output, which can be controlled by the frequency with which the capacitors are switched. The larger the load current, the higher the frequency at which the switched-capacitor supply must be run.

A real switched-capacitor supply suffers additional efficiency degradation due to losses in the switches and overhead associated with generating the clocks and varying their frequency with load. Capacitors with small parasitics capacitances to ground (for example, metal-insulator-metal capacitors) must be used or additional efficiency degradation results. Overall efficiency in generating, for example, a VDD/2 supply voltage is still quite poor (about 60-65%). Furthermore, both linear regulators and switched-capacitor supplies consume huge on-chip areas for both the power transistors (of the linear regulator) and the capacitors (of the switched-capacitor supply).

SUMMARY OF INVENTION

An embodiment described herein provides an energy-efficient way to achieve on-chip dc-dc voltage conversion for both dynamic voltage scaling and high-tension power delivery applications. The approach uses balanced voltage islands running at fractions of the off-chip supply voltage. Charge "discarded" by one domain is then "recycled" to supply energy for another. In this way, ideally, all the energy dissipated by electrons in "dropping" to lower potentials is used for active computation. This results in a very energy-efficiency way of implicitly performing on-chip dc-dc conversion.

This embodiment allows for energy-efficient on-chip voltage regulation. For the sake of simple exposition, assume that two domains of logic operate at VDD/2. The first logic domain is operating between VDD and VDD/2 and the second domain is operating between VDD/2 and ground. The two domains are "stacked," such that the VDD/2 of the first domain and the VDD/2 of the second domain are the same electrical node. If the first domain and second domain are "balanced" then the charge provided by the first domain at VDD/2 as a result of logic evaluation can be used to power the second domain. Another way to view this is that the first voltage domain is acting as a "linear regulator" for the second, but the energy is being used for active computation rather than being wasted. This approach will be general in that voltages other than VDD/2 may be regulated; for example, one domain may operate at VDD/3, while another operates at 2 VDD/3. Similarly, the scheme can be generalized to more than two domains and to regulate down from voltages above VDD; for example, one could bring in an off-chip 3VDD supply and recycle charge through three domains, one operating between 3VDD and 2VDD, the second operating between 2VDD and VDD and the third operating between VDD and ground.

A full system provides for the active regulation of the internal supply nodes of the stack, which can be accomplished with three "levels" of regulation. For the fastest time constants, there should be adequate decoupling capacitance provided on the internal supply nodes. For medium time constants, a linear regulator is used to provide the necessary charge to compensate for imbalances between the two domains sourcing and sinking current to a given internal supply node. These imbalances can come about because of differences in the node capacitances of the two domains or because of differences in circuit activity in the two domains. To compensate for large imbalances or imbalances that exist for extended periods of time, circuits can be moved from one domain to the other.

In one aspect, an integrated circuit with multiple supply voltage domains includes a first domain of electrical components and a second domain of electrical components on the integrated circuit. The first domain of electrical components and the second domain of electrical components are fabricated using a triple well CMOS process or a silicon-on-insulator (SOI) CMOS process to eliminate body-effect issues.

The first domain receives current from a first voltage rail at a first voltage and discharges electrical current to a second voltage rail at a second voltage. The second receives current from the second voltage rail and discharges electrical current to ground. The integrated circuit further includes a voltage regulator for regulating the second voltage on the second voltage rail. An external voltage source provides a supply voltage between the first voltage rail and ground. In one embodiment, the supply voltage from the external voltage source is greater than a voltage requirement of any one of the domains of electrical circuits.

The voltage regulator is a linear regulator and includes a push-pull output stage that allows current to be both sources and sinked from the internal supply node. The regulator also includes a decoupling capacitor electrically connected between the second voltage rail and ground.

In one embodiment, at least one additional region of electrical components is disposed between the first region and the second region, further including a voltage rail between each of the regions of electrical components, each voltage rail being regulated by a voltage regulator. (I'm not sure what you are saying here).

To allow for circuits to be switched between domains, the first domain of electrical components and the second domain of electrical components can be each divided into switchable units, or granules. Each granule is electrically connected to multiplexers such that each granule can selectably supplied current between the first voltage rail and the second voltage rail or between the second voltage rail and the ground rail. Granules are assigned to domains in order to balance the current demands of each domain. The balancing of current domains is determined by the amount of current being sourced or sinked by the regulator.

In another aspect, an integrated circuit with multiple supply voltage domains includes two or more domains of electrical components on the integrated circuit, each domain drawing supply current from its own source supply rail and discharging supply current to its own sink supply rail. The integrated circuit further includes at least one voltage regulator for regulating a supply voltage on at least one supply rail, and at least one source supply rail is electrically connected to at least one sink supply rail.

In another aspect, a method of creating multiple supply voltage domains on an integrated circuit, such that each of two or more regions of electrical components receives electrical power from a distinct supply voltage domain, includes providing two or more regions of electrical components on an integrated circuit. Each region includes a source voltage rail for providing current to the electrical components, and a sink voltage rail for receiving electrical current from the electrical components. The method further includes electrically connecting at least one source voltage rail from one of the regions to at least one sink voltage rail from another of the regions. The method further includes electrically connecting an external voltage source across one of the source voltage rails and one of the sink voltage rails, and regulating a voltage on at least one of the electrically connected pairs of voltage rails.

The method also includes dividing the two or more regions of electrical components into granules that can be multiplexed between the source voltage rails as a function of an amount of current sourced or sinked by the voltage regulator. This allows the regulator to adjust to large imbalances that exist for long periods of time by reassigning granules between domains, improving the efficiency of the system.

The CMOS digital circuits in each of the domains described above operate across different voltage ranges. Level-shifting or converting circuits must be used at these interfaces. There are two approaches to doing this. In the case of dynamic voltage scaling applications, domains can be defined on latch boundaries with full-rail interfaces. Gate-isolated sense-amplifiers-based flip-flops can be easily used for this purpose. For high-tension power delivery applications, level-shifting circuits can be employed.

DESCRIPTION OF THE PREFERRED EMBODIMENTS

Figure 1:
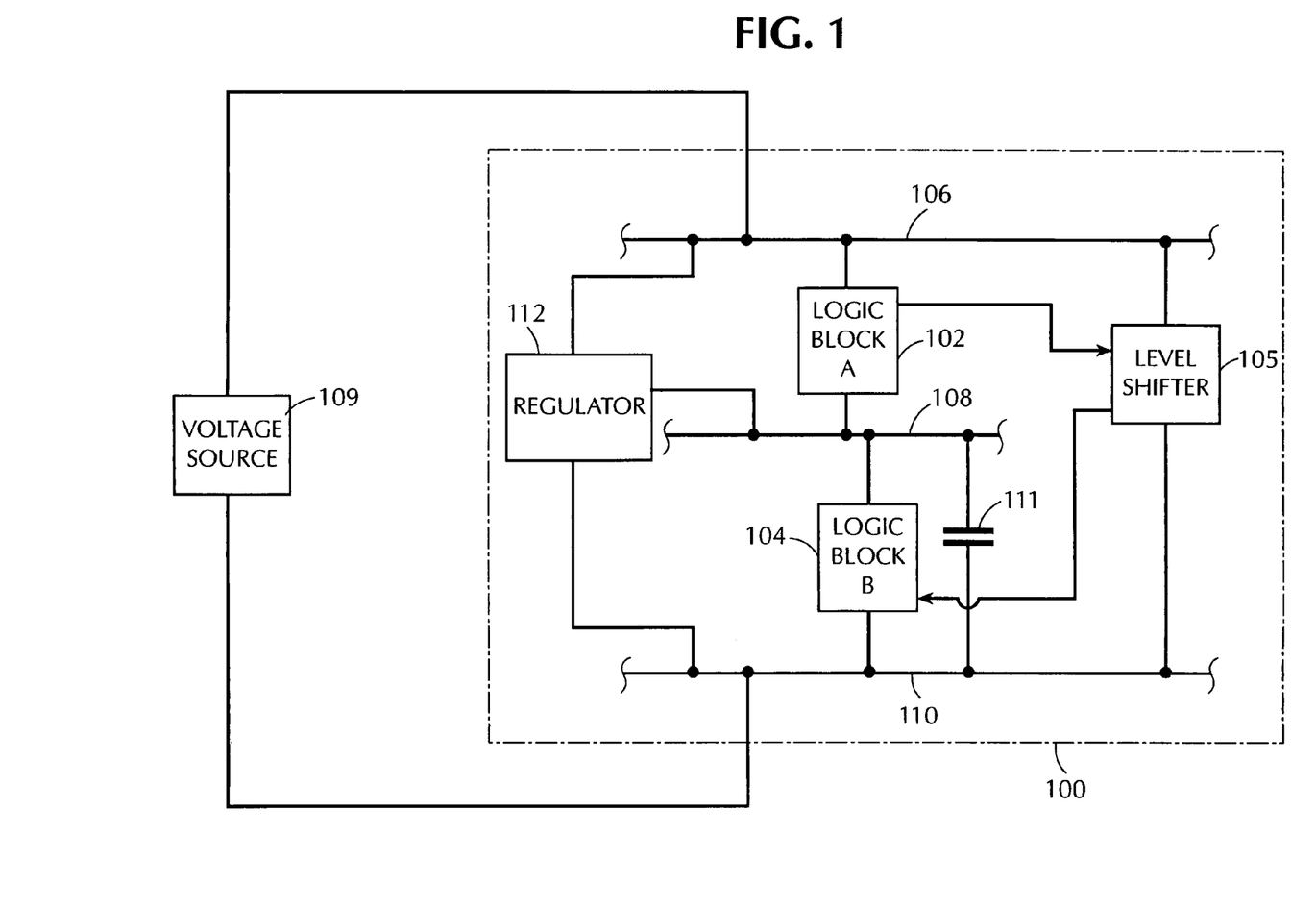
FIG. 1 is a block diagram view of one embodiment of a system having multiple supply voltage domains.

FIG. 1 is a block diagram view of one embodiment of a system having multiple supply voltage domains. In this embodiment, an integrated circuit 100 has a first region, (also referred to herein as "domain") 102 of integrated electrical components (logic block A), a second region, or domain 104 of integrated electrical components (logic block B). Each region is associated with a distinct supply voltage domain. Supply current flows into the first region 102 from a first supply voltage rail 106, and supply current flows out of the first region 102 to a second supply voltage rail 108. Supply current flows into the second region 104 from the second supply voltage rail 108, and supply current flows out of the second region 104 to a third supply voltage rail 110, in this example ground. The first supply voltage rail 106 and the second supply voltage rail 108 thus define the first supply voltage domain, associated with first region 102. The second supply voltage rail 108 and the third supply voltage rail 110 define the second supply voltage domain, associated with the second region 104. An external voltage source 109 provides a global supply voltage for the entire integrated circuit 100. The external voltage source 109 is electrically connected between the first voltage rail 106 and the third voltage rail 110.

Figure 2:
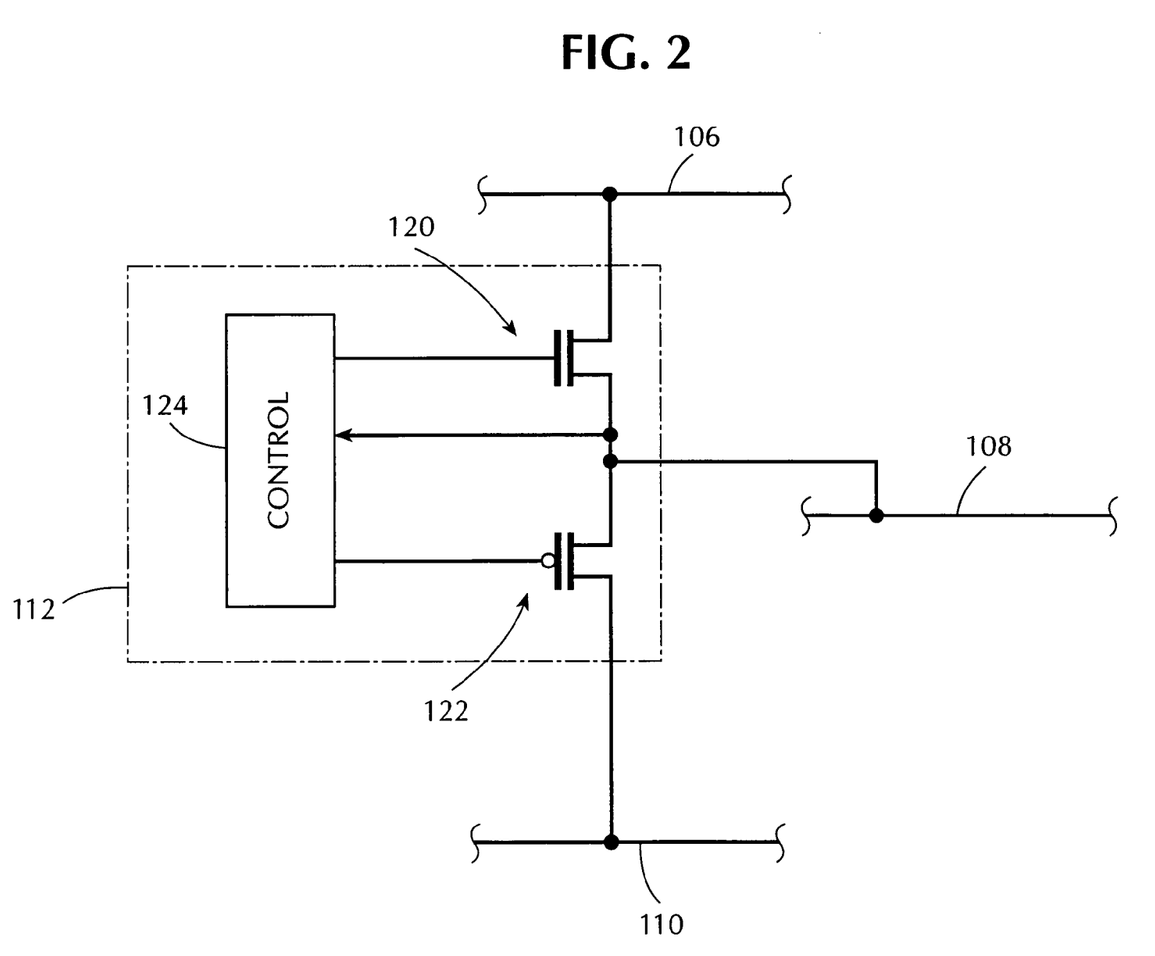
FIG. 2 shows a more detailed view of the voltage regulator in FIG. 1.

A decoupling capacitor 111 is electrically connected between the second voltage rail 108 and the third voltage rail 110. A voltage regulator 112 regulates the voltage on the second supply voltage rail 108 so as to maintain the voltage on the second supply voltage rail 108 to a predetermined value. In one embodiment, the voltage regulator includes a pair of power transistors 120 and 122 in a push-pull configuration, as shown in FIG. 2. The voltage regulator 112 of this embodiment operates by either adding electrical charge to the second supply rail 108 via the first power transistor 120, or removing charge from the second supply rail 108 via the second power transistor 122, depending upon control signals from a control circuit 124.

The circuit 100 also includes a level shifting circuit 105 for making voltages from one domain compatible with other domains. This allows electrical components from different domains to communicate with one another, even though they receive power from different voltage ranges. The function performed by the level shifting circuit 105 may also be performed by other types of level converters known in the art. Specific examples of such level shifters and converters are discussed in more detail herein.

For this embodiment to achieve highest possible efficiency, the charge demands of the first domain 102 and the second domain 104 must remain "balanced," so that the charge demands of the second domain 104 are completely satisfied by electrical current flowing from the first domain 102. A charge imbalance between the first domain 102 and the second domain 104 will inevitably come about because of the differences in the capacitances of the two domains, or because of differences in circuit activity within the two domains. Therefore, a full system must provide for the active regulation of the node, which is accomplished with three "levels" of regulation.

The first level of regulation, the decoupling capacitor 111, compensates for small, short-term voltage fluctuations on the second voltage rail 108 shared by the first domain 102 and the second domain 104. The decoupling capacitor 111 provides enough energy storage to smooth out such fluctuations.

The second level of regulation, the voltage regulator 112, compensates for intermediate (in both duration and in magnitude) voltage fluctuations. The voltage regulator 112 adds or subtracts charge from the second voltage rail 108 to maintain the voltage on the second voltage rail at a predetermined value. The predetermined value of the second rail voltage is generally dependent upon the type of circuitry in the domains, and upon the mode of operation of that circuitry. The power transistors 120 and 122 shown in FIG. 2 do not need to be as large as would normally be used in a linear power supply regulator, since these transistors are only compensating for transient changes in a domain supply voltage, and are not supplying the total power requirements for the circuit domain.

Figure 3:
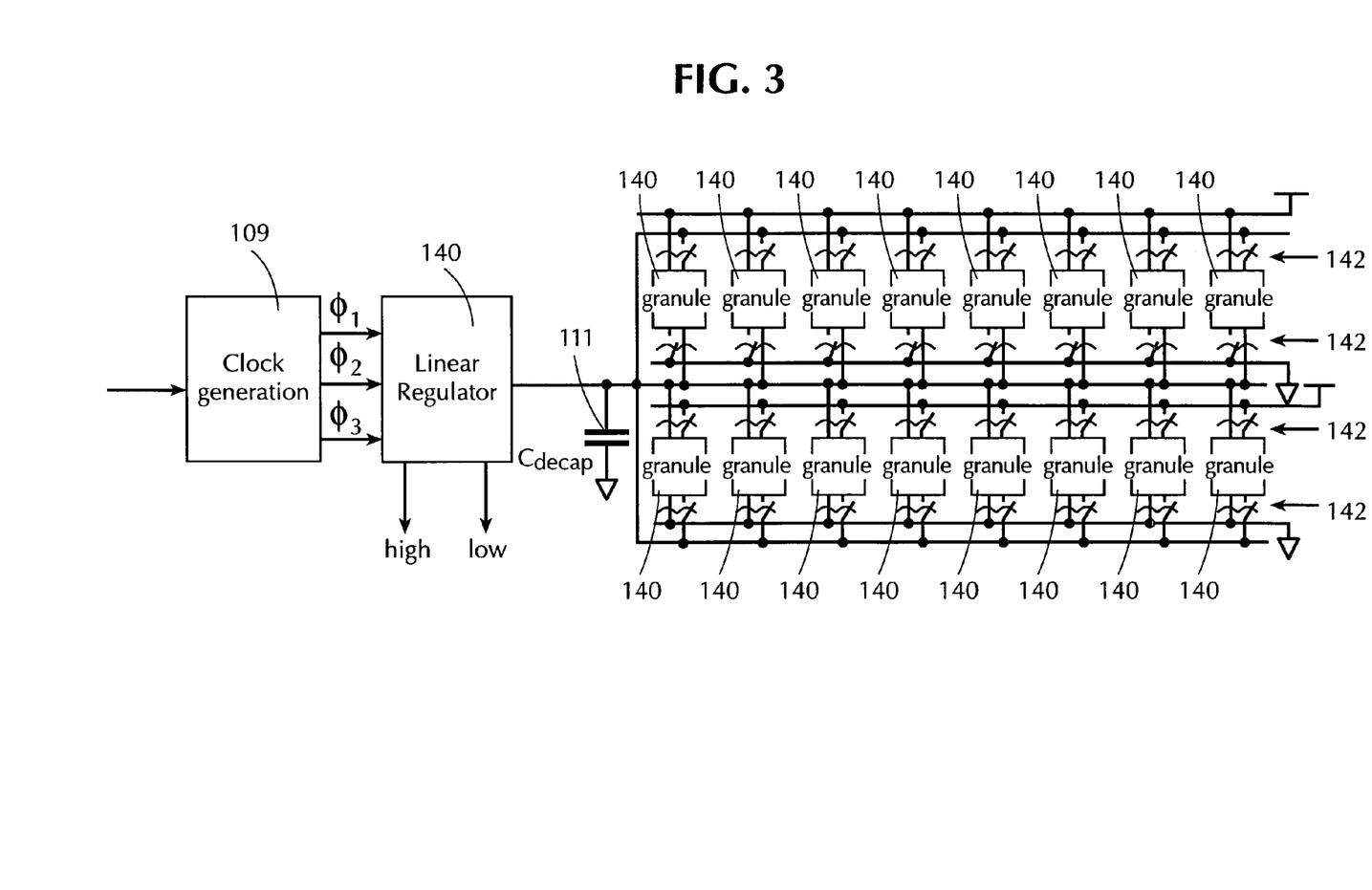
FIG. 3 shows the circuit domains of FIG. 1 divided into granules.

The third level of regulation involves reallocating circuit resources that are shared between domains. This third level of regulation compensates for large charge imbalances or charge imbalances that exist for extended periods of time. Each circuit domain on the integrated circuit 100 is divided into a set of switchable units, referred to herein as "granules." A domain may consist of tens or hundreds of granules, depending on the domain size. Granules can then be exchanged between domains to compensate for a charge imbalance. In one embodiment, granules are exchanged between domains using multiplex transistors switched via a controller (not shown), as shown in FIG. 3, although alternate embodiments may use other switching techniques known in the art. Each granule 140 shares a set of granule multiplexer transistors 142 in both the pull-up networks and the pull-down networks of the granules 140, which determine the domain assignment of a particular granule 140. The transistors 142 also allow a particular domain to be configured for "full-rail" operation, i.e., to be associated with the supply voltage domain of the supply voltage from the external supply voltage source 109 providing global power to the integrated circuit 100. The transistors 142 are similar to the "sleep transistors," which the integrated circuit 100 can employ to control standby power due to sub-threshold leakage. The drain nodes of these multiplexer transistors 142 represent virtual supply and virtual ground nodes. With the help of the decoupling capacitance inherent in these virtual nodes, the size of the transistors 142 should be selected large enough to keep VDS at less than 5% of the target supply voltage for the associated domain.

At the system level, a given logic block can be easily configured to run at full-rail operation, or at half rail, or other fractions of full rail. At half rail, the logic block would be partitioned into two sub-domains, with one sub-domain supplying charge to the other. It should also be noted that using the concepts described herein, the voltage of the external supply voltage source 109 may be greater than the voltage of any domain in the integrated circuit 100. Bringing power into the integrated circuit 100 at a higher voltage than the individual domain voltages reduces power dissipation attributed solely to power distribution.

Charge recycling dc-dc conversions does not work well in "normal" bulk CMOS because of body effect. Because their bodies are still tied to ground, nFETs in the upper voltage domain are heavily body affected. A triple well process avoids this problem, in which the nFETs are constructed in a p-well within an n-well. These p-wells are then tied to the virtual ground of the granule; similarly, the pFET n-wells are tied to the virtual supply of the granule. The junction capacitance of these wells adds intrinsic decoupling to the virtual supply and ground nodes, improving power supply integrity for a given transistor width. Silicon-on-silicon (SOI) technology is also an attractive alternative for this technique, since the bodies float to the required voltage by action of the gate, source and drain.

Special consideration must go into the logic that controls the switching of granules between domains to guarantee system stability and ensure (because of the power overhead associated with switching granules) that switching occurs only when the linear regulator is providing too much current for an extended period of time. Switching granules between domains dissipates energy because of the power required to switch the capacitance of the gates of the (large) granule multiplexer transistors. Furthermore, decoupling capacitance on the virtual supply and ground nodes (provided by the intrinsic well capacitance in the triple-well implementation) must be charged or discharged when a granule switches between domains. Fortunately, most of the device capacitances and interconnect coupling capacitances between wires of the same domain have the character of floating capacitors, simply translating in voltage as domains are switched. It is also possible for granules to switch domains while the digital logic is functioning without stalling or stopping execution.

Figure 4:
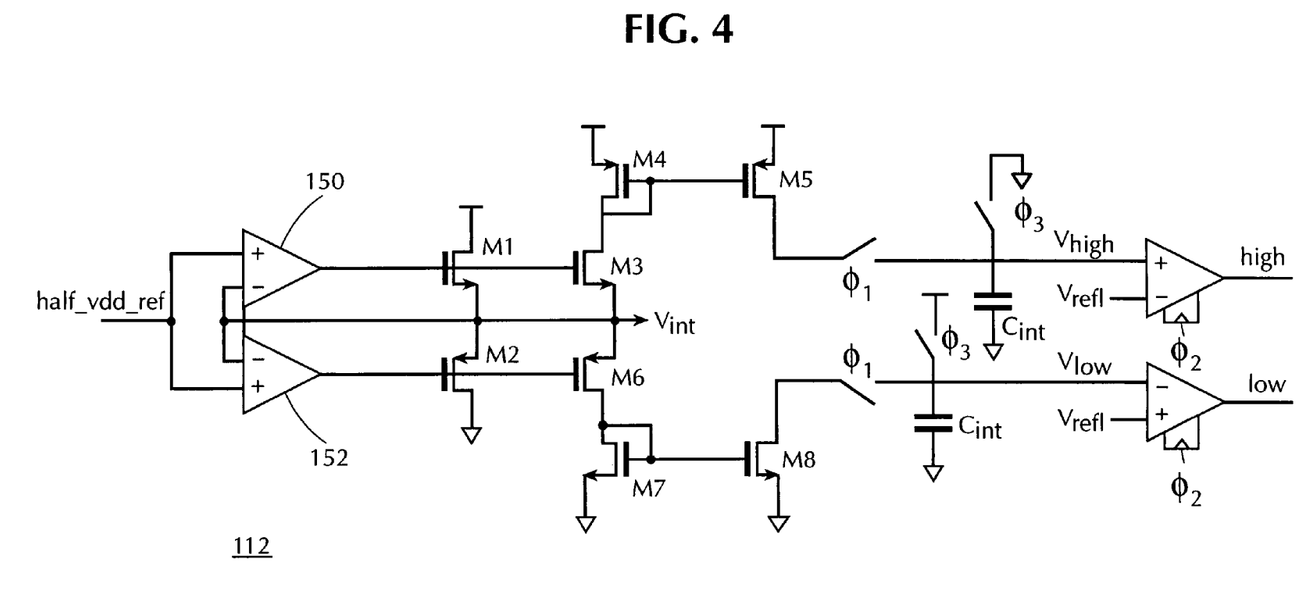
FIG. 4 shows one embodiment of the regulator in FIG. 1, including additional circuitry to monitor the amount of current being sourced or sinked by the linear regulator.

FIG. 4 shows an embodiment of the voltage regulator 112 shown in FIG. 2. The regulator 112 includes two single stage differential amplifiers 150 and 152 and a push-pull output stage (transistors M1 and M2). A simple switched-capacitor divider (not shown) generates the VDD/2 reference (half_vdd_ref) for the linear regulator 112. The regulator 112 has an open-loop gain of 38 dB and a unity gain bandwidth of 130 MHz with a phase margin of 70 degrees. The amplifier 150 driving the transistor M1 is biased with 200 µA, while the amplifier 152 driving M2 is biased with 400 µA. The output stage has a quiescent current of 50 µA. This regulator can source or sink 30 mA before losing regulation.

Power transistors M1 and M2 have widths of 600 µm and 1.2 mm, respectively. Transistors M3 through M5 mirror out a current proportional to that flowing through transistor M1 for integration onto the capacitor Cint, which is approximately 400 fF. Similarly, transistors M6 through M8 mirror out a current proportional to that flowing through transistor M2, also integrated onto a capacitor. Clock phases φ1 and φ3 are used to control the integration, establishing an integration time (tint) of approximately 150 nS. After the integration window, φ3 clocks the comparators to compare the voltages Vhigh and Vlow with the reference levels Vrefh and Vrefl, respectively, producing the signals high and low to the granule-switching control logic.

The use of source-follower transistors M1 and M2 in the output stage of the linear regulator 112 provides better stability and the need for less decoupling capacitance than the more traditional common-source output stage. In many linear regulator applications, the common-source is preferred because of its lower dropout voltage. In this application, dropout voltage is not a concern since we are regulating far from the rails. Decoupling capacitance on Vint must ensure a low enough impedance beyond 100 MHz, where the linear regulator is ineffective; approximately 9 pF for current transients of approximately 5 mA and a regulation requirement of approximately 90 mV. Of this, explicit on-chip thin-oxide decoupling capacitance provides approximately 4 pF, while non-switching circuits and well capacitance provides the remaining 5 pF.

When the average current sourced (sinked) by the linear regulator exceeds 3 mA over an interval of approximately 150 nS, the high (low) signal is asserted to indicate that granules should be switched between domains, the controller randomly chooses a granule, for example, via a linear feedback shift register (LFSR). At most one granule can be "switched" every integration time (tint).

Figure 5:
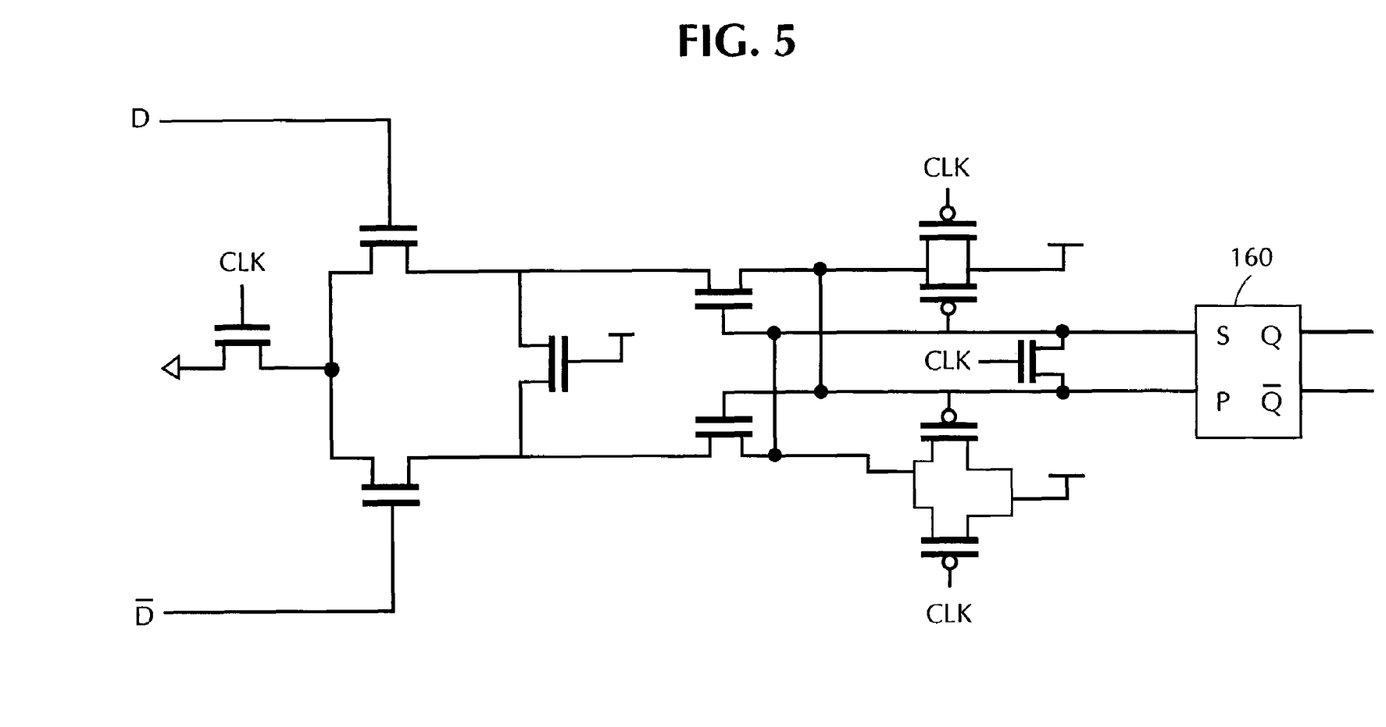
FIG. 5 shows gate-isolated sense-amplifiers-based flip-flops for switching domains on latch boundaries.
Figure 6:
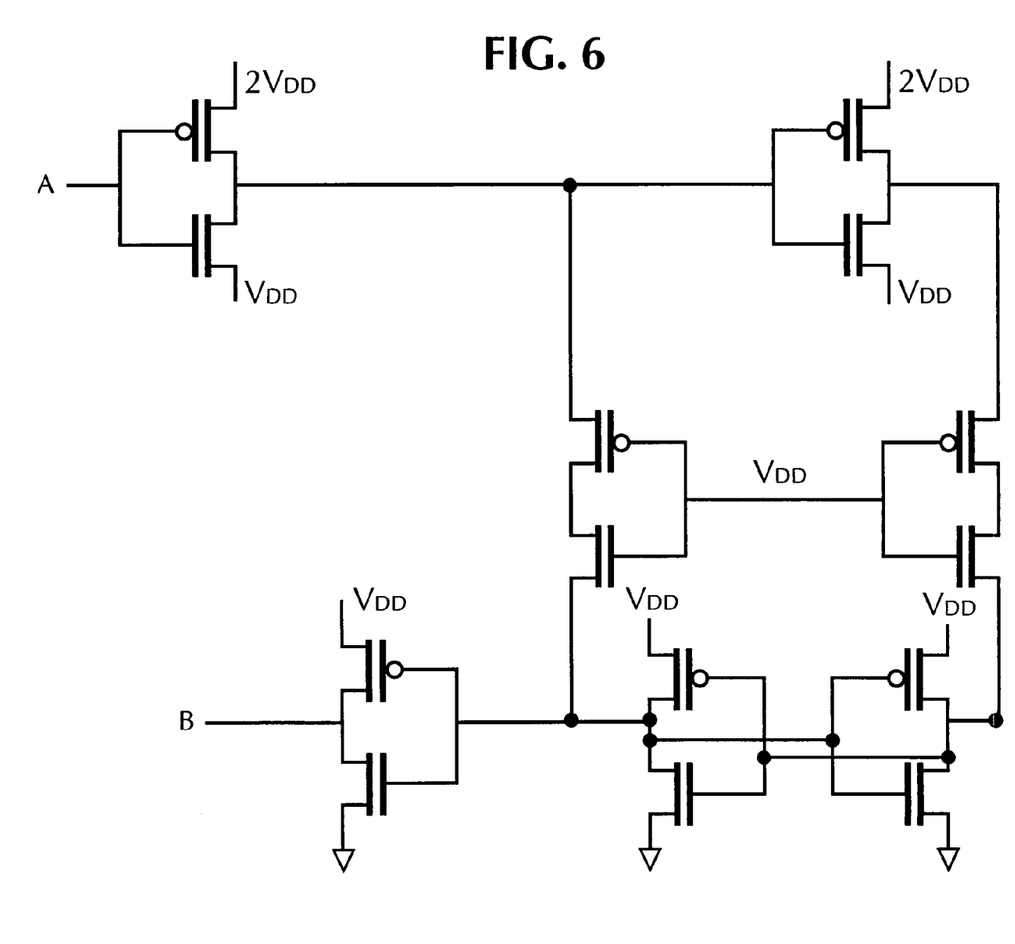
FIG. 6 shows a level shifting circuit for allowing components from different voltage domains to communicate; and, FIG. 7 shows a block diagram of a system with three voltage domains.

The CMOS digital circuits in each of the domains described above operate across different voltage ranges. Level-shifting or converting circuits must be used at these interfaces. There are two approaches to doing this. In the case of dynamic voltage scaling applications, domains can be defined on latch boundaries with full-rail interfaces. Gate-isolated sense-amplifiers-based flip-flops, as shown in FIG. 5 can be easily used for this purpose. D and Dbar could switch between VDD and VDD/2 or between VDD/2 and ground, while the output of the latch 160 swings between VDD and ground. For high-tension power delivery applications, level-shifting circuits can be employed. An example of such a circuit is shown in FIG. 6, which converts a signal A, which swings between 2VDD and VDD, to a signal B that swings between VDD and ground.

Figure 7:
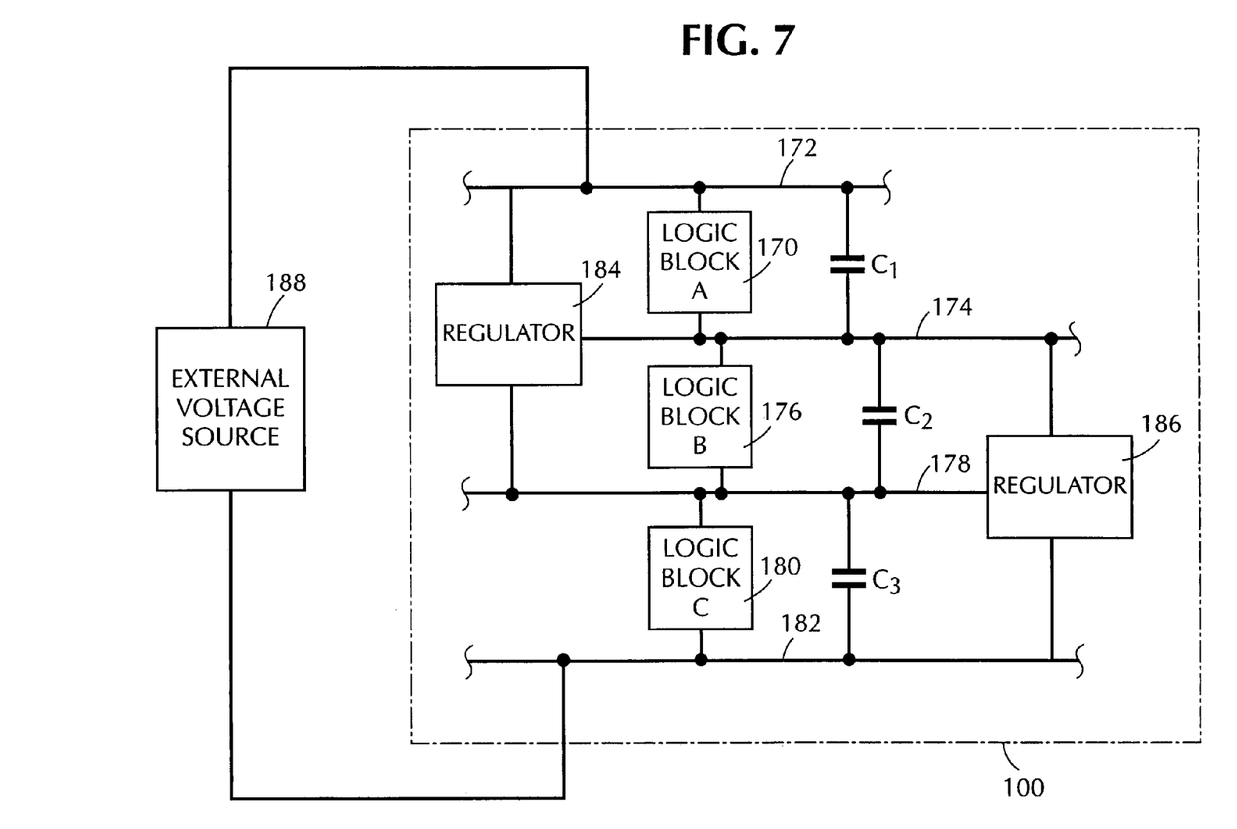

FIG. 7 shows an example of a system with multiple, in this case three, voltage domains. Level shifter (or converter) circuitry is not shown in this figure, although such circuitry is present to allow the different voltage domains to communicate. Logic block A 170 draws supply power from between a first voltage rail 172 and a second voltage rail 174, logic block B 176 draws supply power from between the second voltage rail 174 and a third voltage rail 178, and logic block C 180 draws supply power from the third voltage rail 178 and the fourth voltage rail 182. A first regulator 184 handles voltage regulation of the first, second and third voltage rails 172, 174 and 178. A second regulator 186 handles the voltage regulation of the second, third and fourth voltage rails 174, 178 and 182. In some embodiments, the regulators 184 and 186 communicate to provide for consistent chip regulation. An external voltage source 188 supplies power to the overall circuit 100. For high-tension power delivery, the voltage of the external voltage source 188 is typically significantly higher than the rail voltages of any logic block, i.e., of any of the voltage domains within the device 100. For dynamic voltage scaling, the voltage of the external voltage source 188 is typically at or near the full rail voltage of the domains within the device 100.

Other aspects, modifications, and embodiments are within the scope of the following claims.

What is claimed is:

1. An integrated circuit with multiple supply voltage domains, comprising:
    a first domain of electrical components on the integrated circuit, the first domain receiving current from a first voltage rail at a first voltage and discharging electrical current to a second voltage rail at a second voltage;
    a second domain of electrical components on the integrated circuit, the second domain receiving current from the second voltage rail and discharging electrical current to a third voltage rail at a third voltage; and,
    a voltage regulator for regulating the second voltage on the second voltage rail;
    wherein the first domain of electrical components and the second domain of electrical components are each divided into granules, and each granule is electrically connected to multiplexers such that each granule can selectably receive supply current from either the first voltage rail or the second voltage rail.

2. An integrated circuit according to claim 1, wherein each granule can be selectably switched between domains, so that each granule is supplied current between the first voltage rail and the second voltage rail, or between the second voltage rail and the third voltage rail, as a function of a controller circuit.

3. An integrated circuit with multiple supply voltage domains, comprising:
    two or more domains of electrical components on the integrated circuit, each domain drawing supply current from its own source supply rail and discharging supply current to its own sink supply rail;
    at least one voltage regulator for regulating a supply voltage on at least one supply rail;
    wherein at least one source supply rail is electrically connected to at least one sink supply rail;
    wherein each of the domains of electrical components are divided into granules, and each granule is electrically connected to multiplexers such that each granule can selectably receive supply current from either the first voltage rail or the second voltage rail.

4. An integrated circuit according to claim 3, wherein each granule can be selectably switched between domains, so that each granule is supplied current between the first voltage rail and the second voltage rail, or between the second voltage rail and the third voltage rail, as a function of a controller circuit.

5. A method of creating multiple supply voltage domains on an integrated circuit, such that each of two or more regions of electrical components receives electrical power from a distinct supply voltage domain, comprising:
    providing two or more regions of electrical components on an integrated circuit, wherein each region includes a source voltage rail for providing current to the electrical components, and a sink voltage rail for receiving electrical current from the electrical components;
    electrically connecting at least one source voltage rail from one of the regions to at least one sink voltage rail from another of the regions;
    electrically connecting an external voltage source across one of the source voltage rails and one of the sink voltage rails; and,
    regulating a voltage on at least one of the electrically connected pairs of voltage rails;
    further including dividing the two or more regions of electrical components into granules that can be selectably switched between domains, so that each granule is supplied current between the first voltage rail and the second voltage rail, or between the second voltage rail and the third voltage rail, as a function of a controller circuit.

6. A method according to claim 5, further including:
regulating a first category of voltage fluctuations with a decoupling capacitor;
regulating a second category of voltage fluctuations with a voltage regulator; and,
regulating a third category of voltage fluctuations by multiplexing circuit granules between the two or more regions of electrical components.

7. An integrated circuit with multiple supply voltage domains, comprising:
a first domain of electrical components on the integrated circuit, the first domain receiving current from a first voltage rail at a first voltage and discharging electrical current to a second voltage rail at a second voltage;
a second domain of electrical components on the integrated circuit, the second domain receiving current from the second voltage rail and discharging electrical current to a third voltage rail at a third voltage; and,
a voltage regulator for regulating the second voltage on the second voltage rail, wherein the first domain of electrical components and the second domain of electrical components are each divided into granules, each granule is electrically connected to multiplexers such that each granule can selectably receive supply current from either the first voltage rail or the second voltage rail, and each granule can be selectably switched between domains, so that each granule is supplied current between the first voltage rail and the second voltage rail, or between the second voltage rail and the third voltage rail, as a function of a controller circuit.

8. A method of creating multiple supply voltage domains on an integrated circuit, such that each of two or more regions of electrical components receives electrical power from a distinct supply voltage domain, comprising:
providing two or more regions of electrical components on an integrated circuit, wherein each region includes a source voltage rail for providing current to the electrical components, and a sink voltage rail for receiving electrical current from the electrical components;
electrically connecting at least one source voltage rail from one of the regions to at least one sink voltage rail from another of the regions;
electrically connecting an external voltage source across one of the source voltage rails and one of the sink voltage rails;
regulating a voltage on at least one of the electrically connected pairs of voltage rails by regulating a first category of voltage fluctuations with a decoupling capacitor, regulating a second category of voltage fluctuations with a voltage regulator, and regulating a third category of voltage fluctuations by multiplexing circuit granules between the two or more regions of electrical components; and,
dividing the two or more regions of electrical components into granules that can be multiplexed between the source voltage rails as a function of an amount of current sourced or sinked by the voltage regulator.

* * * * *